(12) United States Patent
Blawid et al.

(10) Patent No.: US 8,018,070 B2
(45) Date of Patent: Sep. 13, 2011

(54) SEMICONDUCTOR DEVICE, METHOD FOR MANUFACTURING SEMICONDUCTOR DEVICES AND MASK SYSTEMS USED IN THE MANUFACTURING OF SEMICONDUCTOR DEVICES

(75) Inventors: Stefan Blawid, Dresden (DE); Ludovic Lattard, Dresden (DE); Roman Knoefler, Dresden (DE); Manuela Gutsch, Dresden (DE); David Pritchard, Dresden (DE); Martin Roessiger, Dresden (DE)

(73) Assignee: Qimonda AG, Munich (DE)

( * ) Notice: Subject to any disclaimer, the term of this patent is extended or adjusted under 35 U.S.C. 154(b) by 983 days.

(21) Appl. No.: 11/738,086

(22) Filed: Apr. 20, 2007

(65) Prior Publication Data
US 2008/0261395 A1 Oct. 23, 2008

(51) Int. Cl.
H01L 23/48 (2006.01)
H01L 23/52 (2006.01)
H01L 29/40 (2006.01)

(52) U.S. Cl. ........... 257/775; 257/E23.01; 257/E21.039; 257/E21.038; 257/E21.538; 257/E21.236

(58) Field of Classification Search .............. 257/48, 257/773, 775, E23.015, E23.01, E21.038, 257/E21.039, E21.236, E21.538, 296; 716/19
See application file for complete search history.

(56) References Cited

U.S. PATENT DOCUMENTS

| | | | |
|---|---|---|---|
| 6,448,591 B1 * | 9/2002 | Juengling | 257/211 |
| 6,759,180 B2 * | 7/2004 | Lee | 430/313 |
| 7,244,638 B2 * | 7/2007 | Caspary et al. | 438/128 |
| 7,327,591 B2 * | 2/2008 | Sadra et al. | 365/63 |
| 7,655,387 B2 * | 2/2010 | Sandhu et al. | 430/314 |
| 7,719,115 B2 * | 5/2010 | Seta | 257/758 |
| 7,767,571 B2 * | 8/2010 | Noelscher et al. | 438/597 |
| 2003/0226128 A1 * | 12/2003 | Arai et al. | 716/10 |
| 2005/0277249 A1 * | 12/2005 | Juengling | 438/257 |
| 2006/0024621 A1 | 2/2006 | Nölscher et al. | |
| 2006/0046422 A1 * | 3/2006 | Tran et al. | 438/401 |
| 2006/0145192 A1 * | 7/2006 | Van Duuren et al. | 257/202 |
| 2006/0177773 A1 * | 8/2006 | Hennig et al. | 430/311 |
| 2006/0180846 A1 * | 8/2006 | Takaishi | 257/314 |

(Continued)

FOREIGN PATENT DOCUMENTS

DE 42 35 609 A1 4/1994

(Continued)

OTHER PUBLICATIONS

Noelscher, C., et al., "Double line shrink lithography at $k_1$=0.16," Microelectronic Engineering 83, 2006, pp. 730-733.

*Primary Examiner* — Matthew Landau
*Assistant Examiner* — Latanya N Crawford
(74) *Attorney, Agent, or Firm* — John S. Economou

(57) ABSTRACT

Semiconductor device with a first structure comprising a plurality of at least in part parallel linear structures, a second structure comprising a plurality of pad structures, forming at least in part one of the group of linear structure, curved structure, piecewise linear structure and piecewise curved structure which is positioned at an angle to the first structure, and the plurality of pad structures are intersecting at least one of the linear structures in the first structure. An electronic device with at least one semiconductor device, methods for manufacturing a semiconductor device and a mask system are also covered.

23 Claims, 19 Drawing Sheets

U.S. PATENT DOCUMENTS

| | | | |
|---|---|---|---|
| 2006/0183258 A1* | 8/2006 | Hennig et al. | 438/29 |
| 2007/0026672 A1* | 2/2007 | Tang et al. | 438/669 |
| 2007/0050748 A1* | 3/2007 | Juengling | 716/19 |
| 2007/0210449 A1* | 9/2007 | Caspary et al. | 257/734 |
| 2007/0215874 A1* | 9/2007 | Furukawa et al. | 257/48 |
| 2007/0218627 A1* | 9/2007 | Lattard et al. | 438/253 |
| 2007/0275309 A1* | 11/2007 | Liu | 430/5 |
| 2008/0085581 A1* | 4/2008 | Kim et al. | 438/241 |
| 2008/0113483 A1* | 5/2008 | Wells | 438/424 |
| 2008/0113511 A1* | 5/2008 | Park et al. | 438/692 |
| 2008/0179705 A1* | 7/2008 | Noelscher et al. | 257/506 |
| 2008/0296732 A1* | 12/2008 | Olson | 257/618 |

FOREIGN PATENT DOCUMENTS

| | | |
|---|---|---|
| DE | 42 35 702 A1 | 4/1994 |
| DE | 10 2004 034 572 A1 | 2/2006 |

* cited by examiner

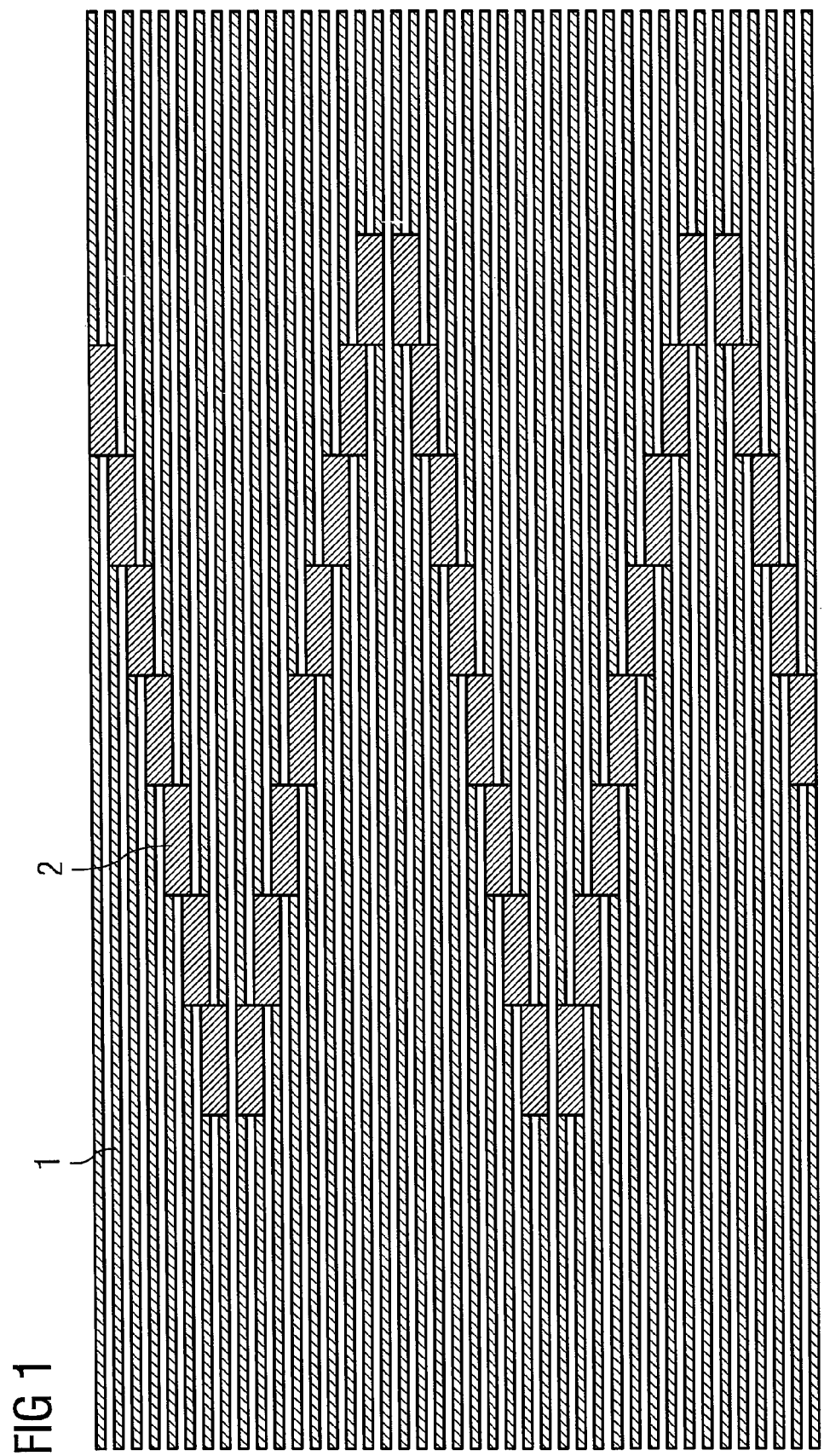

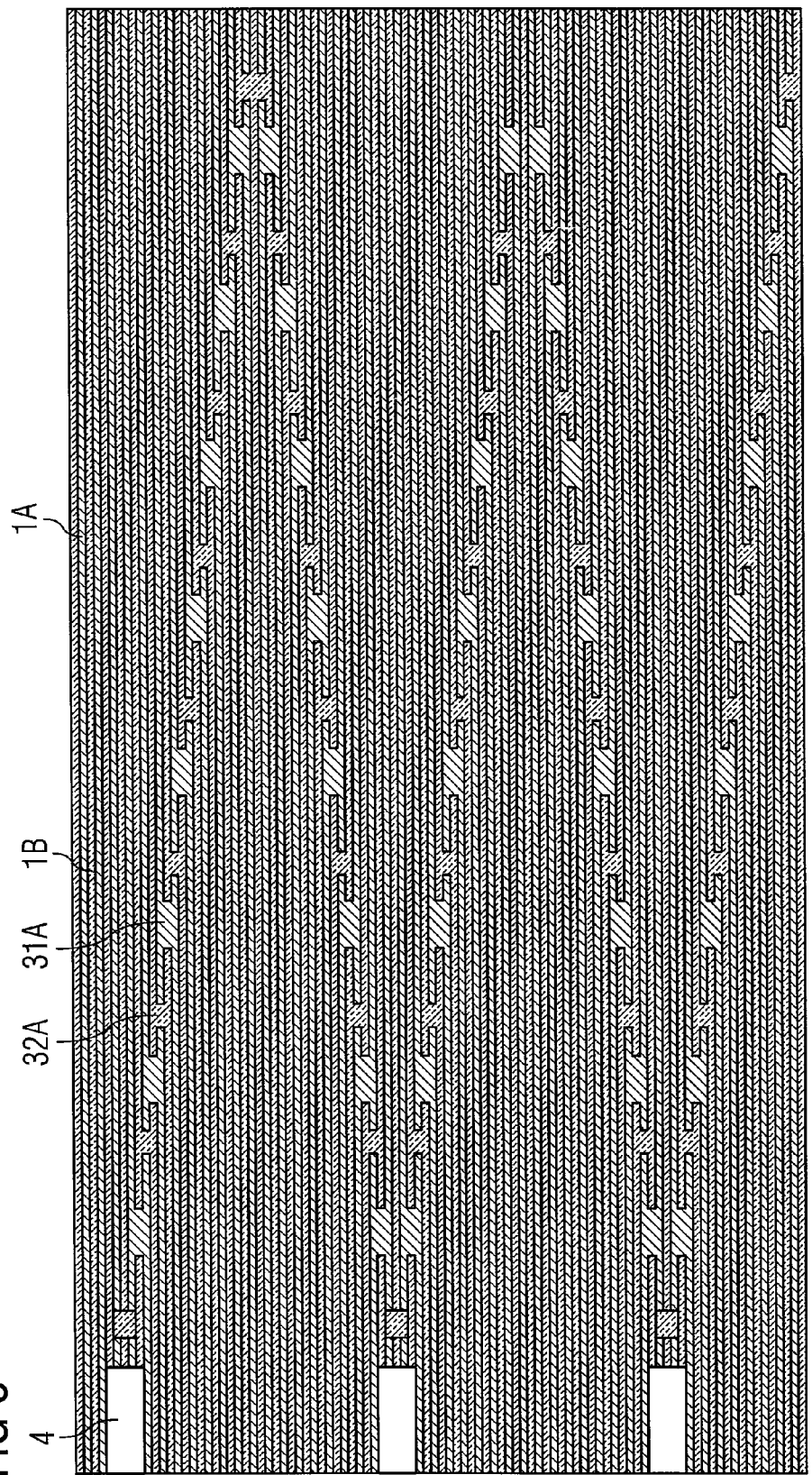

2  1

US 8,018,070 B2

SEMICONDUCTOR DEVICE, METHOD FOR MANUFACTURING SEMICONDUCTOR DEVICES AND MASK SYSTEMS USED IN THE MANUFACTURING OF SEMICONDUCTOR DEVICES

BACKGROUND

Semiconductor devices, such as microprocessors, optoelectronic devices, microelectromechanical devices, memory devices, such as Flash memory, DRAM chips or NROM chips, include arrays of structures as, e.g., memory cells that are arranged in rows and columns. In the exemplary case of memory cells, these devices include gate electrodes for the memory cell transistors, whereby the gate electrodes are connected by word lines, by which the memory cells are addressed.

The word lines are often formed by patterning a conductive layer stack so as to form single word lines that are arranged in parallel. The word lines are electrically insulated from one another laterally by a dielectric material. The lateral distance between two word lines and the width of a word line sum to the pitch of the array of word lines. The pitch is the dimension of the periodicity of a periodic pattern arrangement.

The word lines often form a strictly periodic pattern, in order to reduce the necessary device area as much as possible.

Likewise, bit lines for the memory cells are formed by patterning a conductive layer so as to form the single bit lines which are electrically insulated from one another by a dielectric material.

To use the potential of the existing illumination sources (e.g., lithography with wavelengths of 193 nm or 248 nm), the manufacturing of fine sublithographic structures, especially fine regular line structures, using spacer techniques, has been described, e.g., in the DE 42 35 702 A1 and DE 42 36 609 A1. In DE 42 36 609 A1 a line-by-spacer method is described to produce sublithographic spacers. In US 2006/0024621 A1 and DE 10 2004 034 572 A1 a line-by-spacer-fill and a line-by-liner-fill method are described. Line shrink methods are described in the article in Microelectronic Engineering 83, pages 730 to 733.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 shows a top view of a part of a structure produced by a first mask used for manufacturing a first embodiment of a semiconductor device;

FIG. 8 shows a top view of a part of a structure in a semiconductor device further processed from FIG. 7;

DETAILED DESCRIPTION OF ILLUSTRATIVE EMBODIMENTS

Figure 1A:
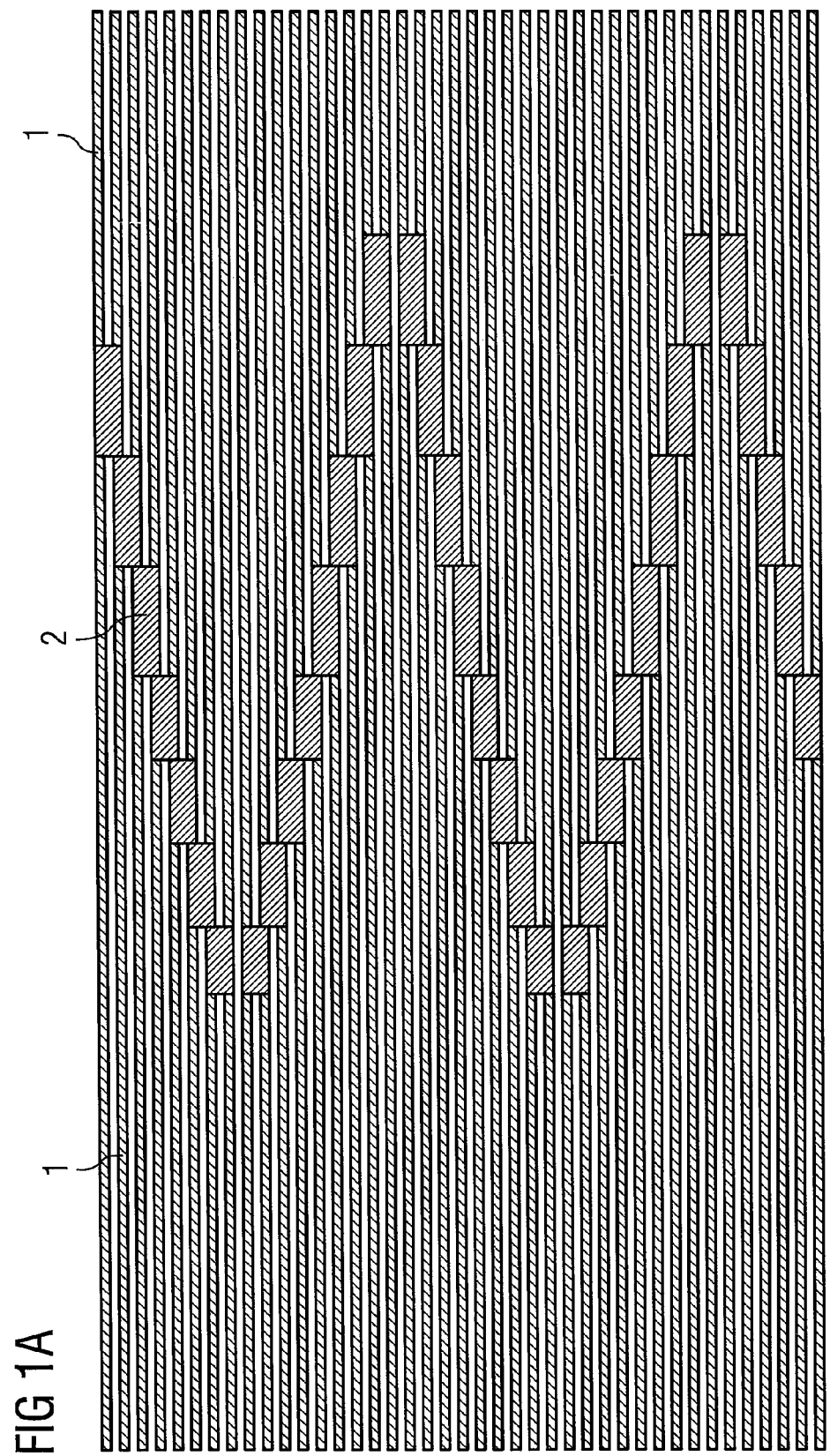
FIG. 1A shows a variant of the structure in FIG. 1 with piecewise linear and curved pad structure.

The following embodiments of the invention are described using representations of schematic views of masks and structures on a substrate. The person skilled in the art will recognize that a pattern on a mask will print as a respective pattern on a substrate using lithography processes known in the art. Therefore, the person skilled in the art will recognize that the description of a mask will also imply the pattern printed on the substrate and vice versa. Furthermore, the person skilled in the art will recognize that the drawings here are a schematic to clarify the embodiments. Images of real structures on a substrate might, e.g., have more rounded edges due to manufacturing conditions. On the other hand it is possible to pre-distort masks to achieve a relatively straight contour on the printed wafer (e.g., FIGS. 6A, 6B, 9A, 9B).

Furthermore, all embodiments shown refer to structures on or in a semiconductor device, which can be, as just a few examples, a microprocessor, a memory chip, an optoelectronical device or a microelectromechanical device. A Flash or a DRAM memory chip is an example for a semiconductor device but the structures, methods and systems described here can also be used in semiconductor devices such as the ones mentioned above. The application of such semiconductor devices are, e.g., computers and communication devices and all other areas in which semiconductor devices are used.

In FIG. 1 a part of a structure produced by a first mask for manufacturing structure in a semiconductor device is shown.

For chips, such as memory chips, it is important that a dense array of the first structure 1 in the GC layer needs to be contacted with one of the following layers. Therefore, landing pads for conductive contacts are positioned at the edge of an array, resulting in a known fan-out pattern, either as a one-sided or a double sided fan-out array.

In the first embodiment the patterning of staggered contacts within an array structure, i.e., the first structure 1, is shown.

The first structure 1 is part of a word line array in the memory chip. The parallel, linear word lines of the first structure 1 are patterned on the substrate (FIG. 4) very tightly using pitch fragmentation techniques (FIG. 3) or double patterning.

With pitch fragmentation techniques spacer structures are used to generate patterns which could not be manufactured by the illumination sources in currently used lithography systems (e.g., 193 nm lithography). Pitch fragmentation techniques are not limited to theses technologies.

The spacer structures 20 are manufactured by depositing a thin spacer layer 20 over a structure 1. After removing the horizontal parts of the spacer layer 20, the spacer structures 20 are lining the vertical sides of the structures 1, here the first structure 1 (see FIGS. 3, 4).

FIG. 1 shows the first structure 1 on the mask which will be used as the basis for the spacer layer 20, as will be explained in more detail in FIG. 3.

The first structure 1 comprises a plurality of linear structures. Furthermore, the pattern shown in FIG. 1 comprises a second structure with a plurality of rectangular shapes which form at least in part a linear sequence of pad structures 2 which is positioned at an angle to the first structure 1. The angle is here approximately 10°. The angle depends on the distance between the linear elements of the first structure 1 and the length of the rectangular shapes in the pad structures 2.

Here, and in the following FIG. 1 the embodiments have a linear pattern of pad structures going across the linear structures 1. The person skilled in the art will recognize that the pattern of the pad structures 2 can also be a sequence of piecewise linear patterns and piecewise curved patterns while cutting across the linear structures 1. An example for such a structure is given in FIG. 1A in which the pad structures 2 show a slight curve. The further processing steps and the resulting structures can also be achieved by using a structure according to FIG. 1A. For the sake of simplicity, the further embodiments of the invention use linear patterns for the pad structures 2.

Pad structures 2 are used in the following as landing pads for contacts. The pad structures 2 are here described as rectangles. The person skilled in the art notices that polygons, like trapezoidal shapes are possible. Furthermore it should be noted, that a rectangular shape printed on a wafer might be subjected to rounding effects caused by the processing. Furthermore a rectangular shape printed on a wafer might be caused by a pre-distorted, non-rectangular shape on a mask (and vice-versa).

The given examples are not limited to that use. A pad structure means in this context a widening of an area on a mask or a substrate.

As indicated in FIG. 1, the second structure comprises five linear parts in which each of the rectangular pad structures 2 are positioned in a staggered way thereby intersecting at least one of the linear structures in the first structure 1. The intersection could also be interpreted as two structures intersecting or overlapping each other. Furthermore the intersecting could be interpreted as the superposition or penetration of two structures.

Figure 1B:
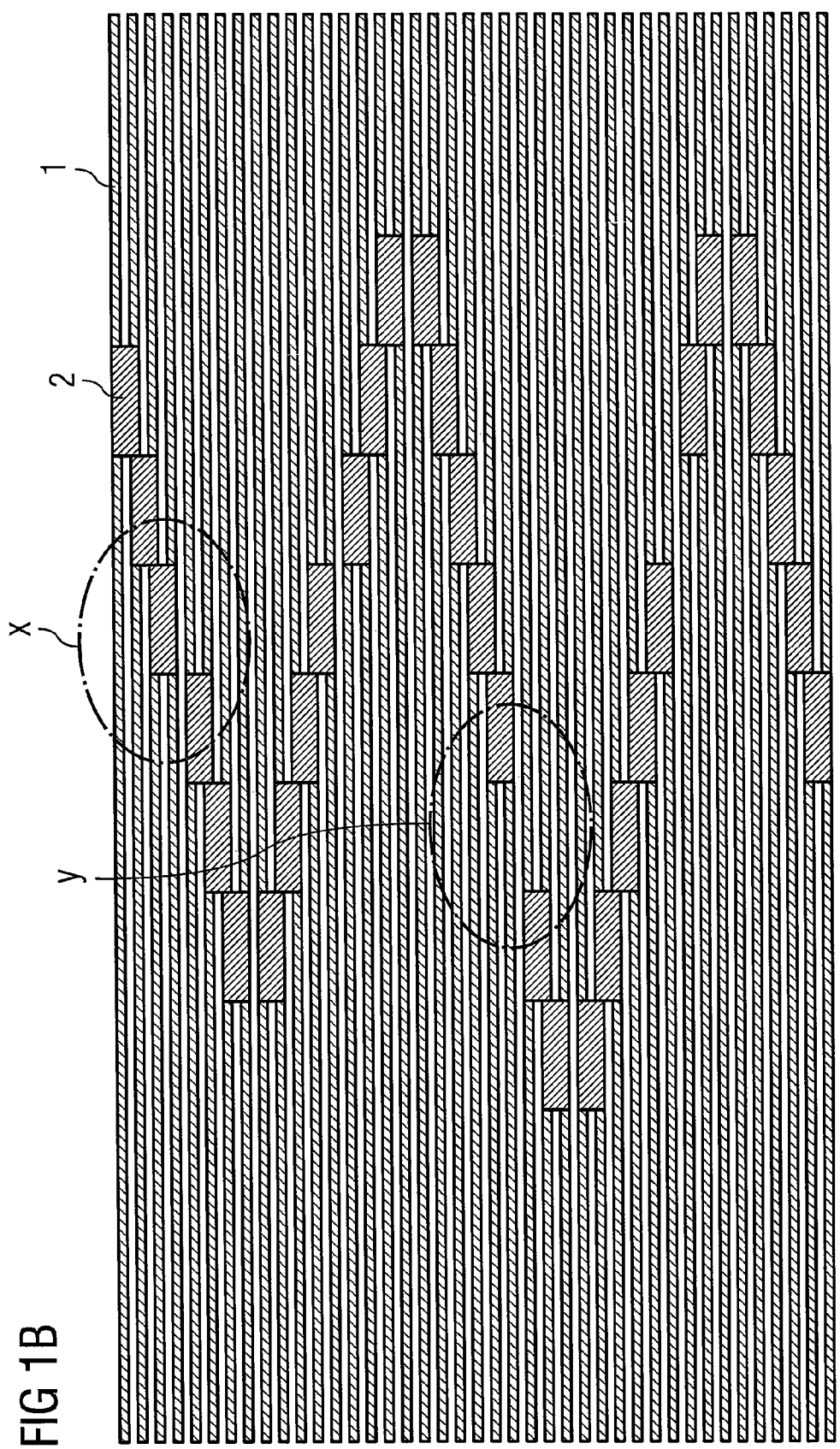
FIG. 1B shows a further variant of the structure in FIG. 1 with pad structures in different ways.

In FIG. 1B further variants of the patterning for the pad structures 2 are shown. In the area labeled X a pad structure 2 is omitted, resulting in a slight step since the other pad structures 2 abut the omitted area.

In the area denoted by Y a pad pattern structure 2 exhibits a gap by omitting a pad structure 2.

In both cases the pad structures 2 form piecewise linear structures across the linear structure 1.

The person skilled in the art will recognize that the piecewise linear structures and curved structures can be combined.

Figure 2:
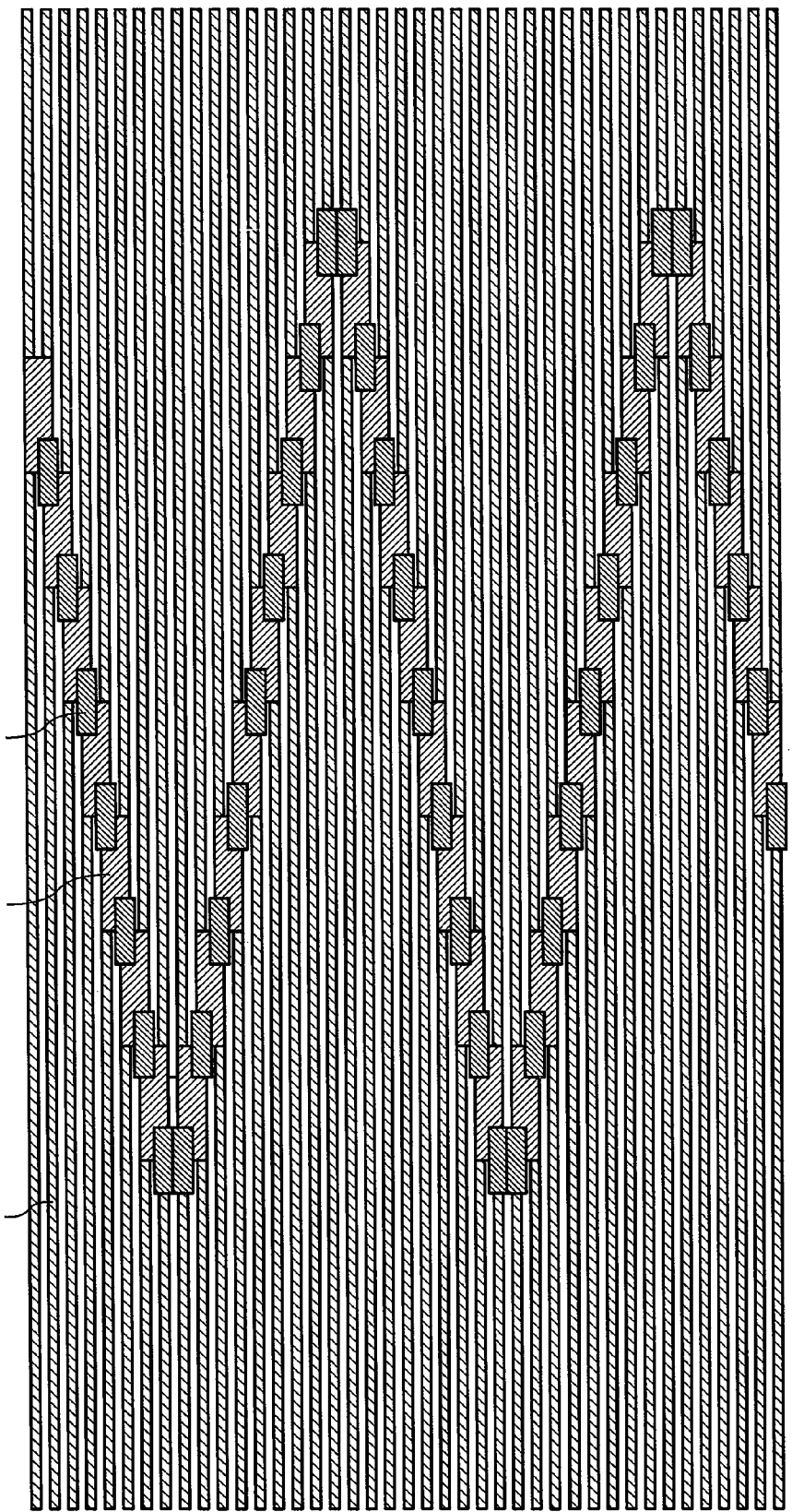
FIG. 2 shows a top view of a part of a structure produced by a second mask used for manufacturing the semiconductor device in the first embodiment.

A second mask is shown in FIG. 2. Here, contact hole 3, like areas are positioned adjacent to the solid GC blocks, i.e., the pad structures 2 in the second structure. The contact holes 3 intersect the pad structures 2.

There are different methods for generating a space between the second structures 2. One method is, e.g., a double exposure process, which produces a superposition of two latent images in a resist. Double exposure means the illumination of one resist layer with two different masks. The resist is etched subsequently.

Another method uses double lithography to make space for contact holes 3 between the second structures 2. Double lithography means that two different lithography steps are used. Typically one lithography step comprises the exposure of a single mask and the subsequent structuring of a resist, substrate or hard mask.

The width of the contact holes 3 is determined by the pitch. The length of the contact holes 3 can be varied as space on the substrate and the contact resistance allows.

Figure 2A:
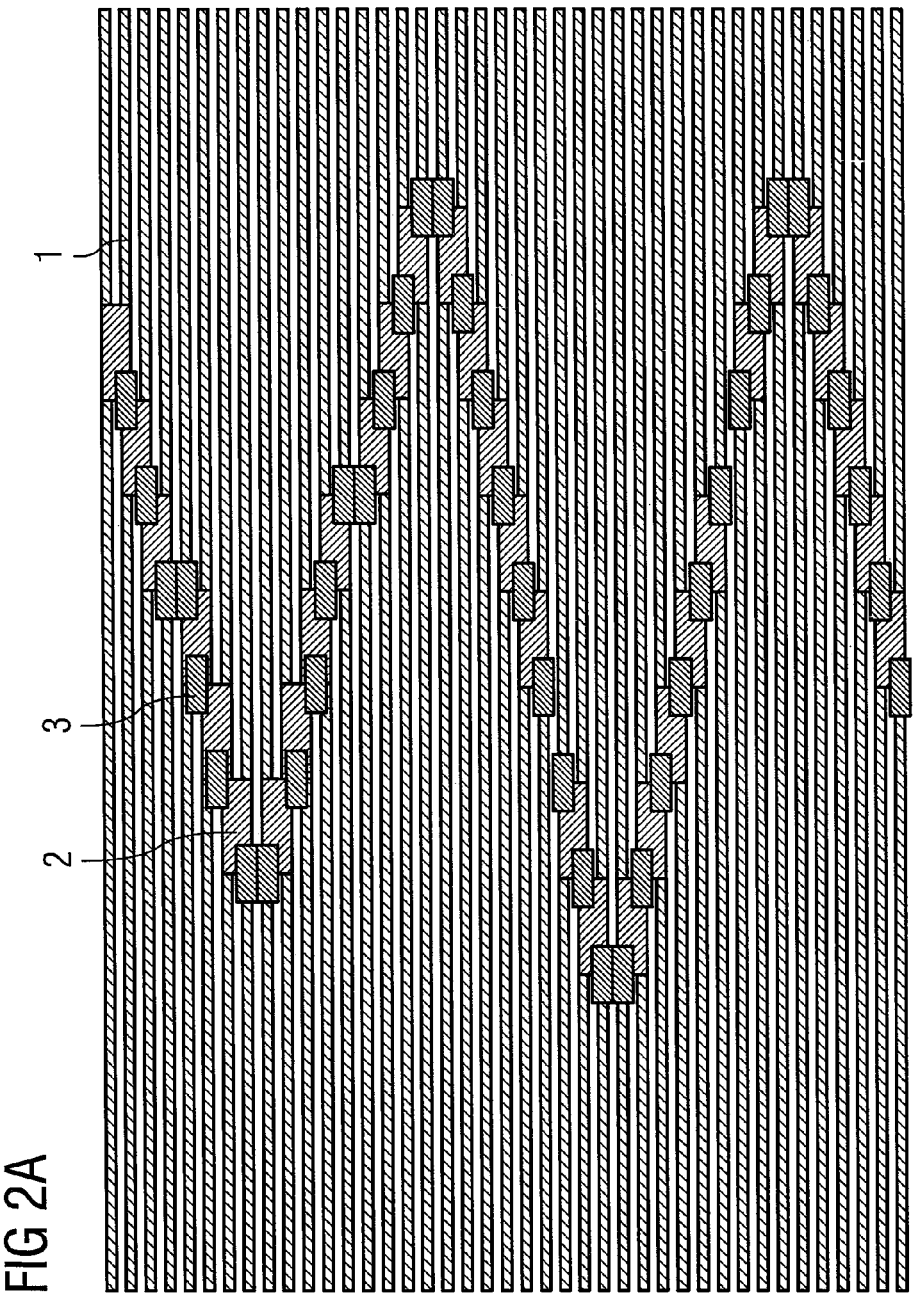
FIG. 2A shows a top view of a part of a structure produced by second marks given the pattern depicted in FIG. 1B.

FIG. 2A shows the result of the situation according to FIG. 1A.

Figure 5:
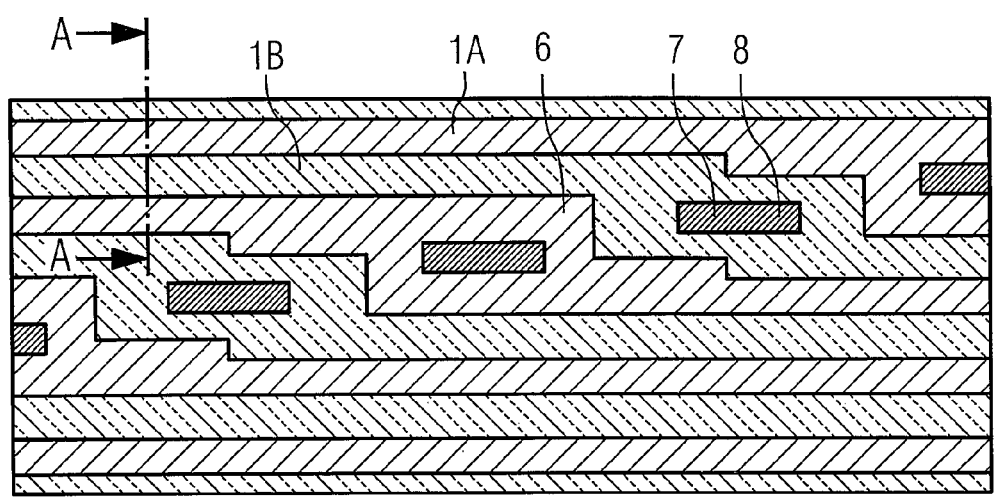
FIG. 5 shows a detail of a printed landing pad area on the substrate as indicated in FIG. 4 according to the first embodiment.

In FIG. 3A to 3D manufacturing steps for a spacer technique are described in cross sections along line A-A in FIG. 5, i.e., across the first structure 1. This spacer technique is only provided here by way of example.

Figure 3A:
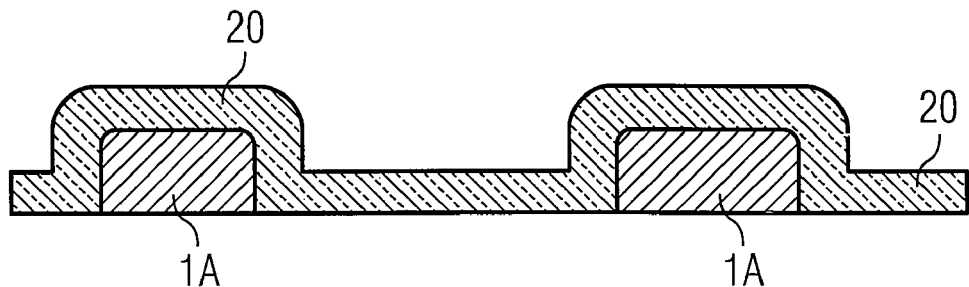
FIG. 3A-D show different process steps for an exemplary spacer technique used in the manufacturing of the semiconductor device.

Starting points in FIG. 3A are two parallel first structures 1A. In, e.g., a memory chip, those structures 1A, will be, e.g., word lines. The two structures 1A are printed by the first structure 1 on the mask, as shown in FIG. 1. The first structures 1A can be made from conducting material or be a part of a hard mask (e.g., polysilicon or nitride).

The two structures 1A are covered with a spacer layer 20 (FIG. 3A). The spacer 20 in particular lines the vertical sides of the structures 1A. This manufacturing step is principally known from spacer techniques. By the way of example material for the spacer are oxides or nitrides.

Figure 3B:
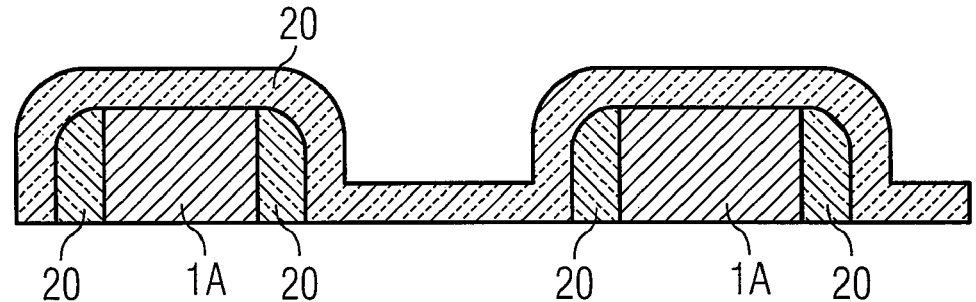

After removing the horizontal portions of the spacer layer 20 a fill structure 21 is deposited over the structures 1A (FIG. 3B). This is a self-aligning process for the fill structure 21. The fill structure 21 can be made from a second conducting material (the first structure 1A being the first conducting material) or it can be made from the same hard mask materials mentioned above.

Figure 3C:
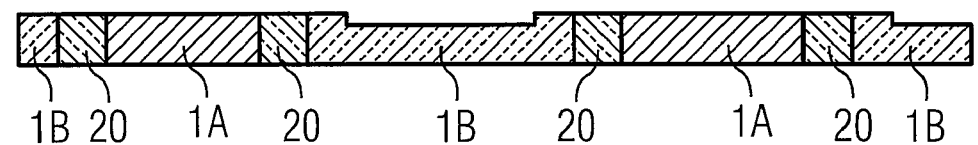

The next process step is a CMP process step, polishing the fill structure 21 and the top parts of the spacer structure 20 and the structures 1A (FIG. 3C). The fill structure has become a second conductive word line 1B parallel to the already existing word line 1A.

Figure 3D:
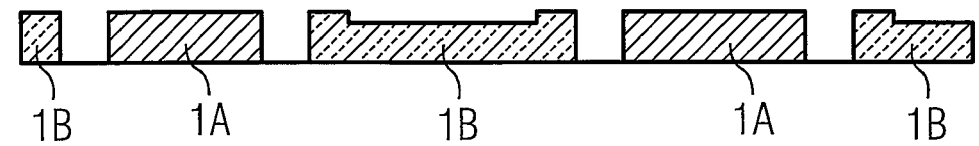

After an optional etching the spacer structure 2, the spacer structure 2 is formed by an airfilled gap or more generally a void, as shown in FIG. 3D.

In case the structures 1A, 1B are made of conducting materials and the spacer structure 20 is dielectric, the spacer structure 20 can stay in place, i.e., the situation depicted in FIG. 3C. If structures 1A, 1B are parts of a hard mask, the situation shown in FIG. 3D would occur before the further processing, i.e. an etching using the hard mask.

Therefore the spacer 20 will be between the line patterns 1A, 1B on the substrate after a first etching process step. The pitch will be fragmented by the spacer structures 20. The array lines, i.e., the first structure 1, in this embodiment are at 65 nm half pitch. In other embodiments the half pitch is in the range of 100 nm to 30 nm, especially 48 nm.

With one illumination step and the spacer technique, two word lines 1A, 1B, separated by the spacer structures 20 by a very small, sublithographic distance can be manufactured.

In an embodiment the structure 1 on the first mask is used for the manufacturing of a sublithographic spacer structure 20 on a substrate with a pitch fragmentation technique.

In another embodiment the sublithographic spacer structure 20 is produced by at least one of the groups of line-by-spacer method, line-shrink method, space-shrink method and electron beam processing.

It is a further embodiment, in which the mask system comprises a pad structure 2 with a rectangular structure. Further it is possible that the pad structure 2 is part of one of the groups of staggered pattern, single sided fan-out pattern and double sided fan-out pattern.

Furthermore, in another embodiment the first structure is part of one of the groups of array pattern, bit line pattern and word line pattern. It is also possible, if the mask system is used for the manufacturing of one of the groups of memory chip, Flash memory chip, DRAM memory chip, NROM memory chip, optoelectronic device microprocessor and microelectromechanical system.

Figure 4:
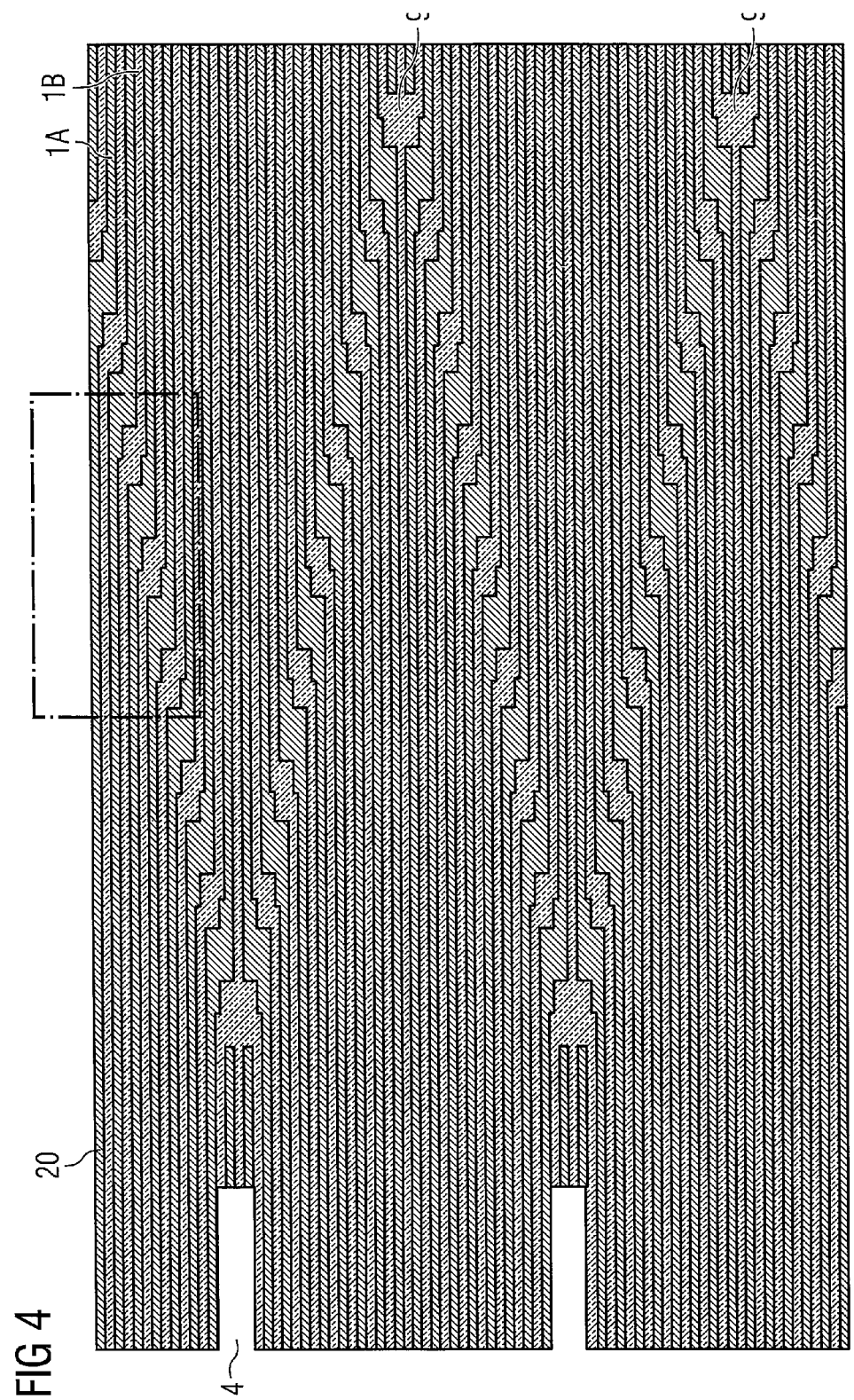
FIG. 4 shows a top view of a part of a pattern in a semiconductor device further processed from the structure in FIGS. 1 and 2.

In FIG. 4 the two word lines 1A (depicted as white in FIG. 4), 1B (depicted as black in FIG. 4) are shown as printed on a substrate, e.g., silicon wafer substrate. The thin dielectric spacer liners 20 (depicted in FIG. 4 as grey liners to the black word line 1A) are separating the word lines 1A, 1B. One of the word lines 1A is formed by the first structure 1 on the mask, the other word line 1B is formed in a fill step using the sublithographic spacers 20 to separate the conductive word lines 1A, 1B.

It should be noted that the use of sublithographic spacers 20 and word lines 1A, 1B in a pitch fragmentation process is one embodiment, but not limiting. The described embodiment generally applies to the manufacturing of a staggered pad pattern as shown, e.g., in FIG. 5.

As can be seen in FIGS. 4 and 5, between the two word lines 1A, 1B the rectangular shape 2 of the first mask is printed into a rectangular shape linking parallel word lines 1A (i.e., the black lines in FIG. 5). In FIG. 5 the marked area in FIG. 4 is shown enlarged. The rectangular area is here a printed GC landing pad 6.

The two parallel word lines 1A, 1B of the same kind (e.g., two black lines 1B in FIG. 5) are connected by a widening of one of the lines 1A, 1B or both lines 1A, 1B. The widening is facilitated by structures 2, 3 on the mask (FIGS. 1, 2). This way the staggered pattern of the pad structures is manufactured. This development of pad structures can be common in other embodiments.

The word line 1A is bordered by two other word lines 1B which have corresponding pads 7 patterned during the fill processing step, shown in FIG. 5. Both pads 6, 7 widen the word lines 1A, 1B in a regular pattern as can best be seen in FIG. 5. All pads 6, 7 are oriented in a linear pattern up to a turning point 9, shown in FIG. 4. The linear pattern of the pads 6, 7 changes direction there. In the end all word lines 1A, 1B comprise at least one landing pad 6, 7 each. This is a very compact arrangement of the pad structures 6, 7 which allows a very compact contacting of the semiconductor device.

In the enlarged FIG. 5 it is shown that within the landing pads 6, 7 GC contacts 8 are positioned. Since the regular array pattern translates into a regular contact pattern, contacting the word lines 1A, 1B is enhanced.

The embodiment has been described in the context of word lines. But the pad pattern cutting across a linear conducting line structure, array structure or bit line pattern or structure can be used in other contexts within semiconductor devices.

In a further process step, here only given as an example, the word lines in an area 4 can be removed for further structuring.

Figure 6A:
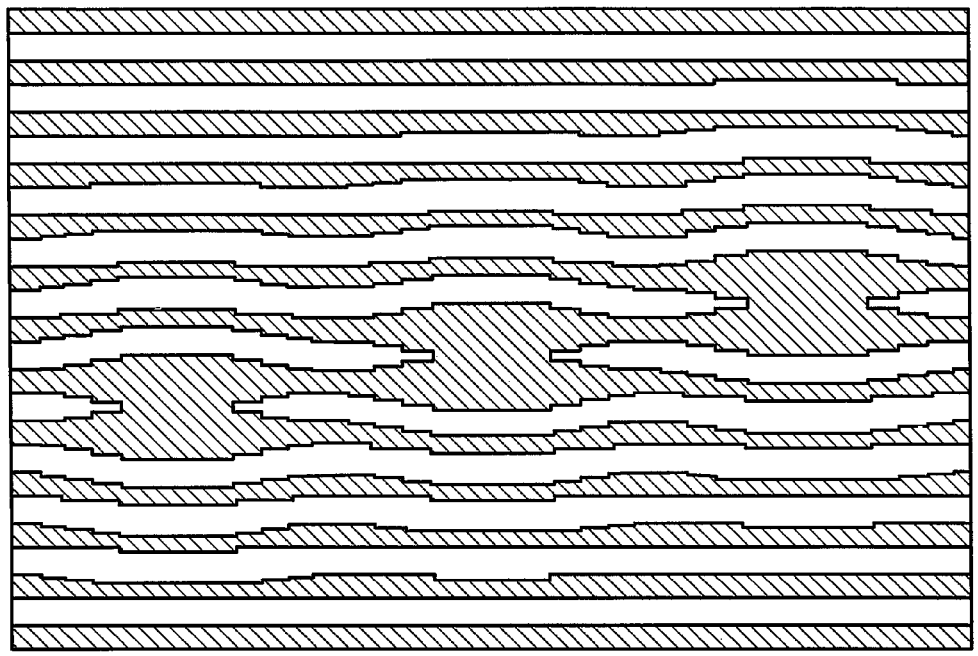
FIG. 6A shows a part of a pre-distorted mask structure to produce a pad structure.

FIG. 6A shows a part of a pre distorted mask structure. The structures 1 which will print as word lines 1A, 1B are connected by a structure 2 through which print as a pad structure on the substrate.

Figure 6B:
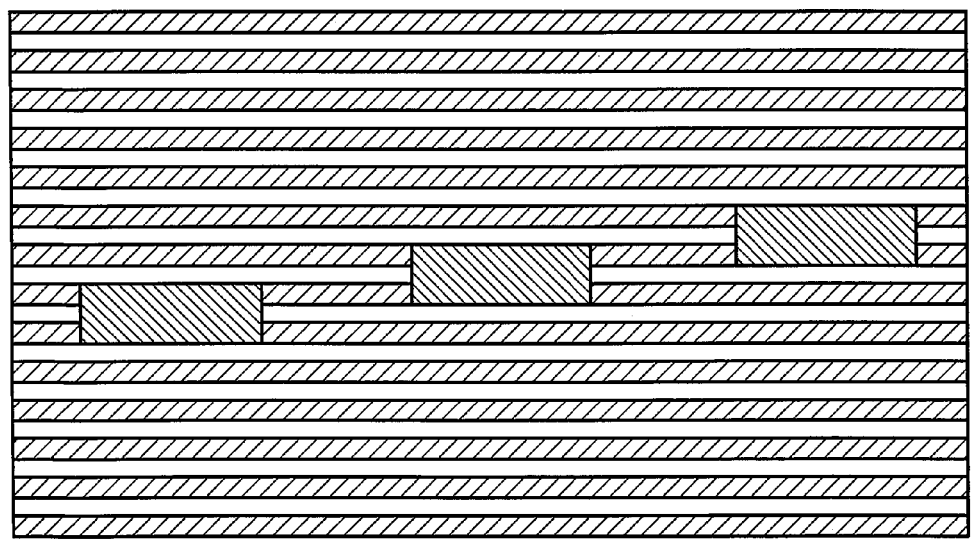
FIG. 6B shows schematically the result on the wafer using the mask according to FIG. 6A.

FIG. 6B shows the result on a wafer using the mask pattern shown in FIG. 6A. The pad structure 2 form a linear structure intersection the word line structure 1 under an angle.

A second embodiment is described in connection with FIGS. 7 and 8. This second embodiment is a variation of the first embodiment but uses only one mask, one illumination step and a sublithographic spacer technique.

Figure 7:
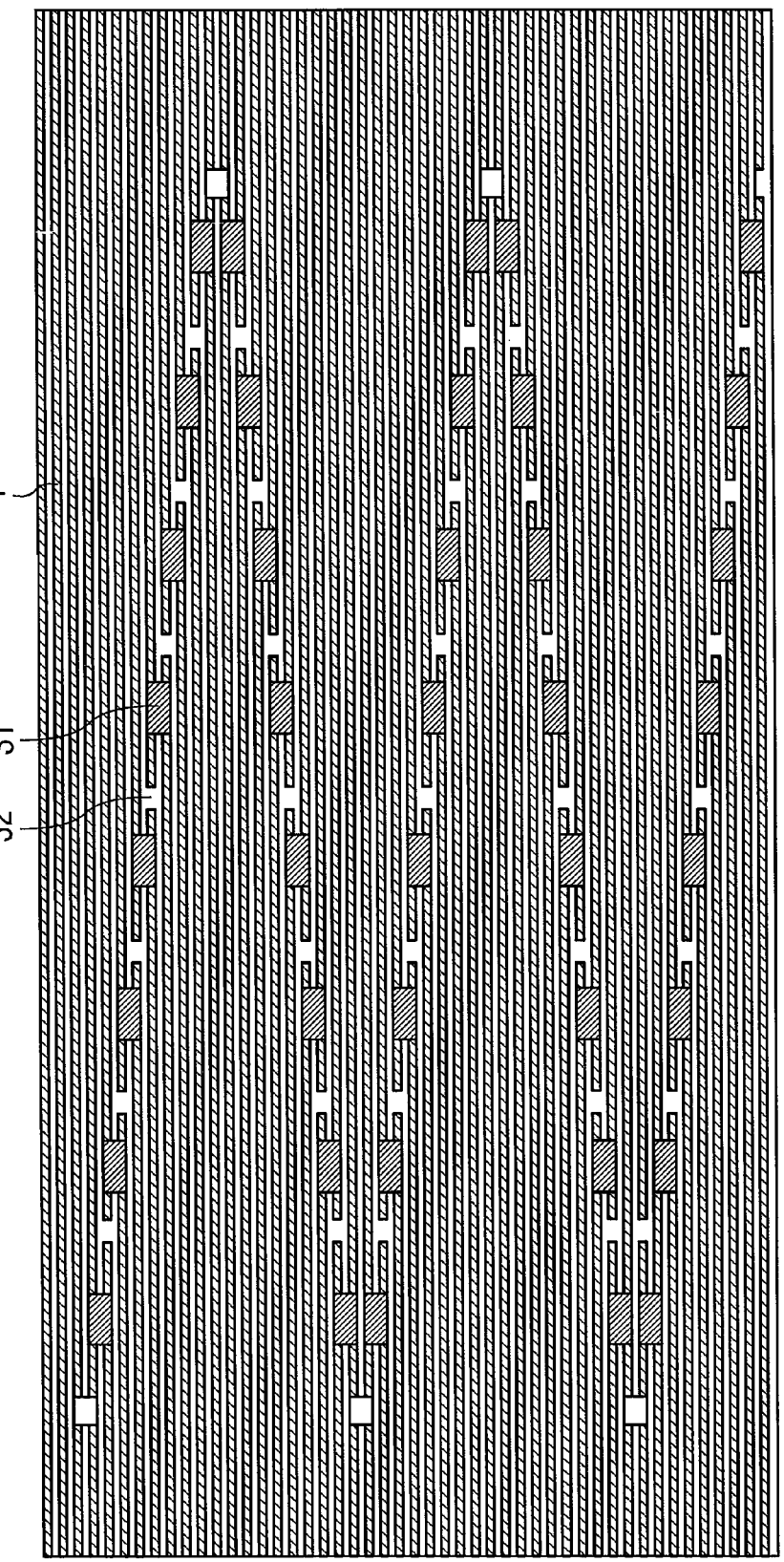
FIG. 7 shows a top view of a part of a structure produced by a mask used for manufacturing a second embodiment of a semiconductor device.

FIG. 7 shows schematically a top view of the structure on a substrate. As in the first embodiment (see FIG. 1) a linear first structure 1 is part of an array, which can be, e.g., a memory chip.

The second structure comprises a plurality of pad structures 31, forming at least in part a linear sequence of pad structures 31 which is positioned at an angle to the first structure 1. The plurality of first pad structures 31 is intersecting at least one of the linear structures in the first structure 1.

The angle between the linear sequences of the first structure 1 and the linear sequence of the first pad structures 31 is approximately 5°. The first pad structures 31 going in an essentially zigzag pattern across the first structure 1, like in the first embodiment. Due to the intersection of the first structure 1 and the second pad structure 32, landing pad structures 31A are formed on the substrate (see FIG. 8).

Collinear to the sequence of the first pad structures 31 the pattern comprises a plurality of second pad structures 32. The first structure 1 comprising at least one gap between two first pad structures 31 forming the second pad structures 32.

In FIG. 8 the printed result is shown, after applying a spacer technique, as described in connection with FIG. 3A to 3C, to obtain two word lines 1A, 1B.

The first structure 1A, 1B comprising the plurality of linear structures and the plurality of first pad structures 31A are patterning the substrate, so that at least in part a linear sequence of the first pad structures 31A is formed on the substrate. The at least one sequence of first pad structures 31A is positioned at an angle to the first structure 1A, 1B so that the first pad structures 31A are intersecting at least one of the linear structures 1 in the first structure.

Furthermore, the plurality of second pad structures 32A is formed in part collinear to the first pad structures 31A by a pitch fragmentation technique subsequently to the single lithography step of this embodiment.

As in the first embodiment, word lines 1A, 1B are patterned by sublithographic spacer techniques, but the second embodiment of the method uses only one mask. Since both pad structures 31A, 32A are printed in the same step, the pad structures require somewhat more space.

Here as well, the pad structures 31A, 32A are formed by a regular widening of one or two parallel word lines 1A, 1B.

In the manufacturing of the second embodiment an analog mask system as in the first is used, i.e., only using one mask.

Figure 9A:
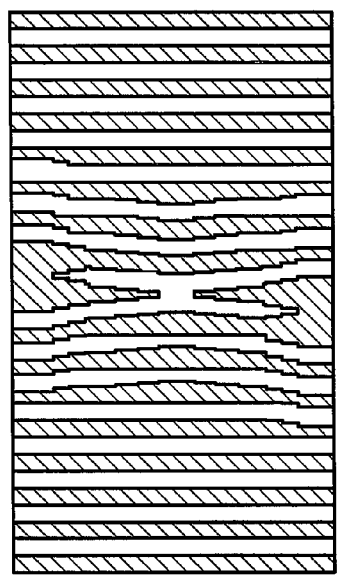
FIG. 9A shows a part of a pre-distorted mask structure to produce a pad structure.
Figure 9B:
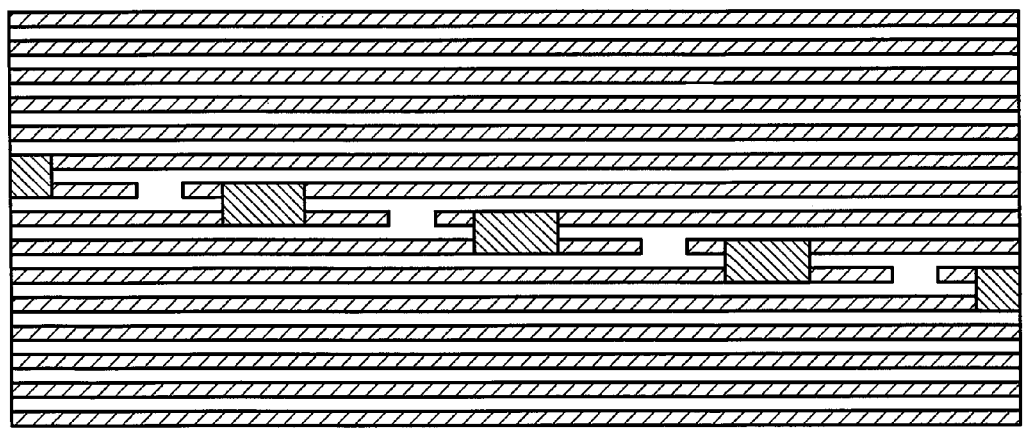
FIG. 9B shows schematically the result on the wafer using the mask according to FIG. 6A.

Analog to FIG. 6A, FIG. 9A shows a part of a pre-distorted mask, FIG. 9B shows the printed result of the mask according to FIG. 9A.

Figure 10:
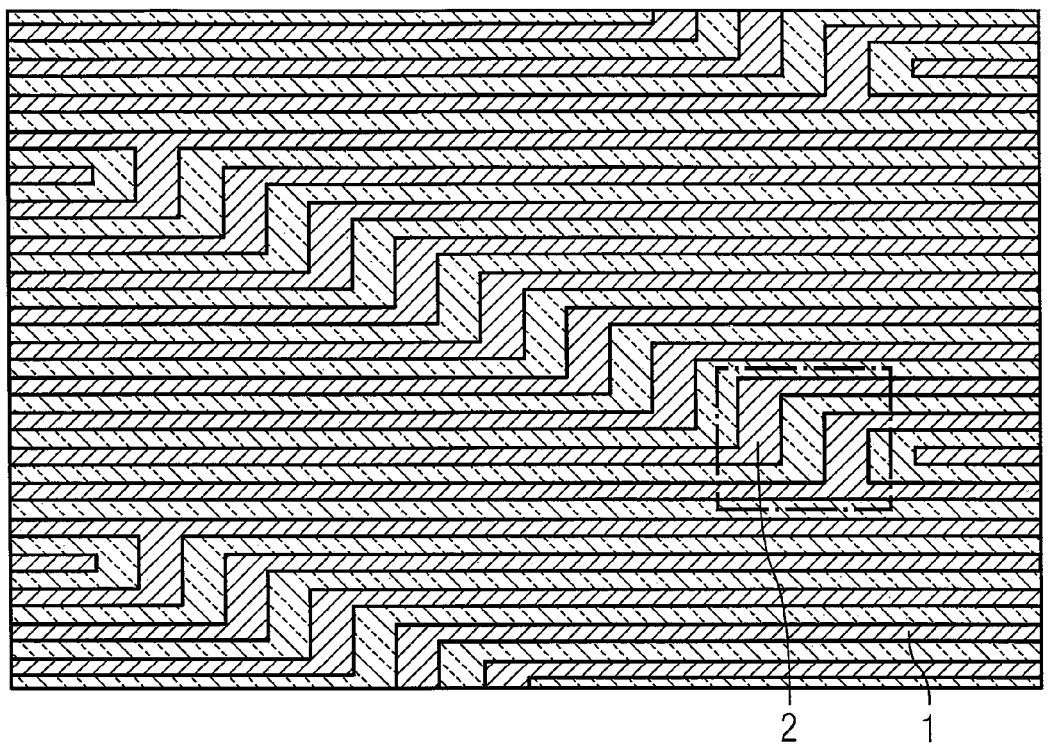
FIG. 10 shows a top view of a part of a structure produced by a mask used for manufacturing a third embodiment of a semiconductor device.
Figure 11:
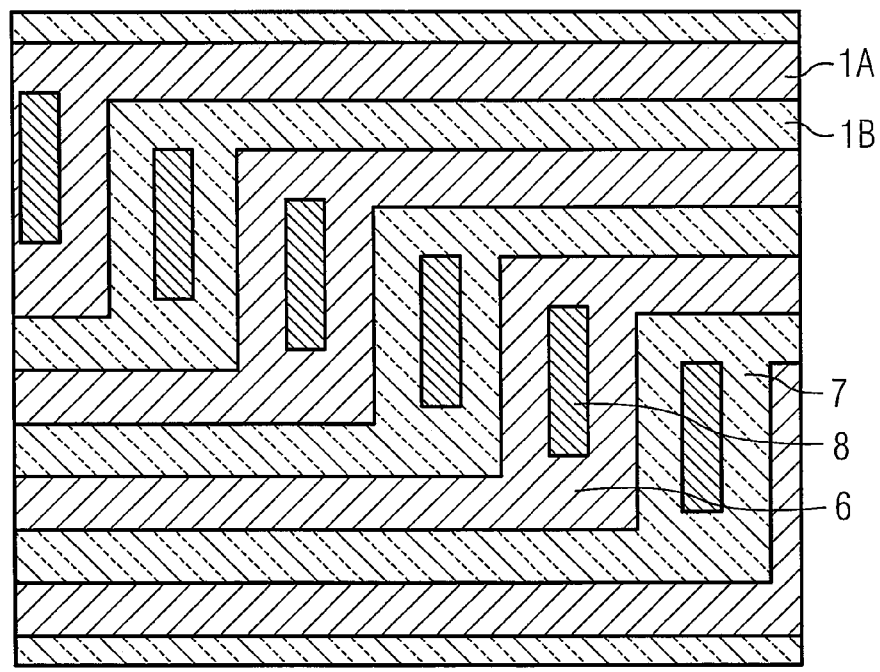
FIG. 11 shows a detail of a printed landing pad area on the substrate as indicated in FIG. 10.

In FIGS. 10 and 11 a third embodiment is described. FIG. 10 schematically shows a part of a structure on a wafer with an array structure 1 as first structure. Unlike the first structures 1 in the first embodiment (FIG. 1) and the second embodiment (FIG. 7), the first structure 1 is only in parts linear. The linearity is interrupted by 90° bends in which the width of the linear structure is also increased. The widened section of the first structure 1 comprises the second structure 2 which will result in the printed semiconductor device as a pad structure.

As can be seen in FIGS. 10 and 11, between the two word lines 1A, 1B the rectangular shape 2 of the widened first structure of the first mask is printed into a rectangular shape linking parallel word lines 1A (i.e., the black lines in FIG. 11). In FIG. 11 the marked area in FIG. 10 is shown enlarged. The rectangular area is here a printed GC landing pad 6.

The word line 1B with the landing pad 6 is manufactured with the fill step of the spacer technique described in connection with FIG. 3.

The two parallel word lines 1A, 1B of the same kind (e.g., two black lines 1B in FIG. 10) are connected by a widening of one of the lines 1A, 1B or both lines 1A, 1B. The widening is facilitated by structures 2 on the mask (FIG. 10). This way the staggered pattern of the pad structures is manufactured.

The word line 1A is bordered by two other word lines 1B which have corresponding pads 7 patterned during the fill processing step. Both pads 6, 7 widen the word lines 1A, 1B in a regular pattern as can best be seen in FIG. 11. The word lines 1A, 1B comprise at least one landing pad 6, 7 each. This is a very compact arrangement of the pad structures 6, 7 which allows a very compact contacting of the semiconductor device.

In the enlarged FIG. 11 it is shown that within the landing pads 6, 7 GC contacts 8 are positioned. Since the regular array pattern translates into a regular contact pattern, contacting the word lines 1A, 1B is enhanced.

In the manufacturing of the third embodiment an analog mask system as in the second embodiment is used. The advantage of this embodiment is that the first structure is geometrically relatively simple.

Figure 12:
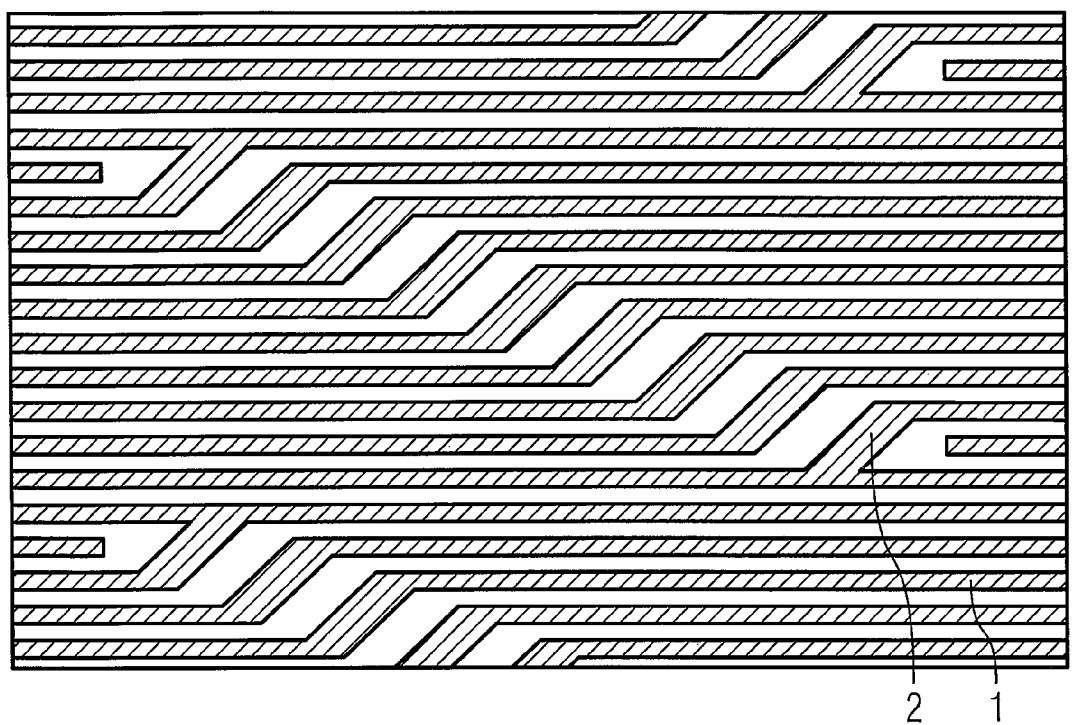
FIG. 12 shows a top view of a first variation of the structure for the third embodiment.
Figure 13:
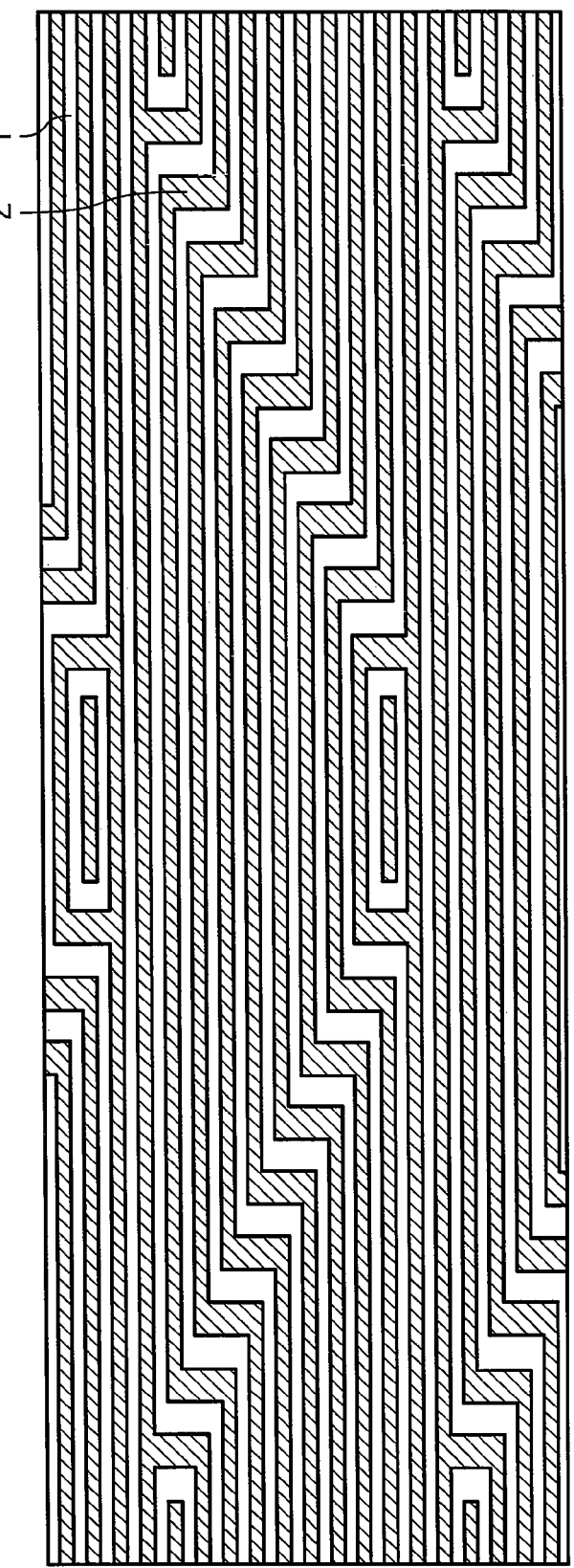
FIG. 13 shows a top view of a second variation of the structure for the third embodiment.

In FIGS. 12 and 13 variants of the third embodiment are shown. In FIG. 12 the part of the first structure 1 is not perpendicular to the line array but tilted. Therefore, the landing pad as printed on the substrate will not be rectangular but a parallelogram. In FIG. 13 the shape of the widening of the first structure 1, and consequently the printed landing pads, are similar to the one depicted in FIG. 10. But in FIG. 13 the linear pad structures 2 (i.e., the widened sections of the first structure) are forming a more complex pattern, not unlike the one shown in FIG. 1.

Figure 14:
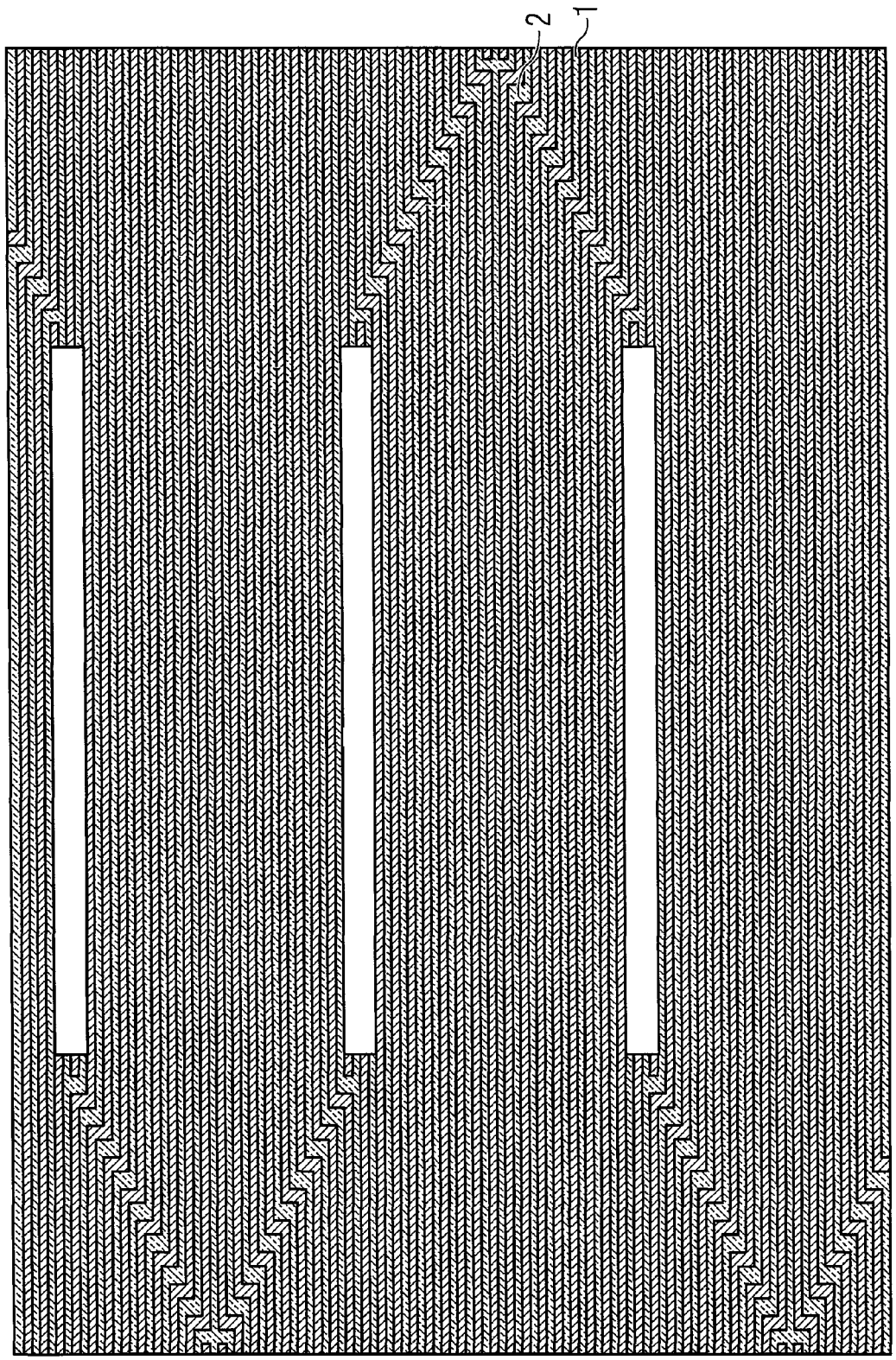
FIG. 14 shows a schematic top view of the structure of a fourth embodiment.
Figure 15:
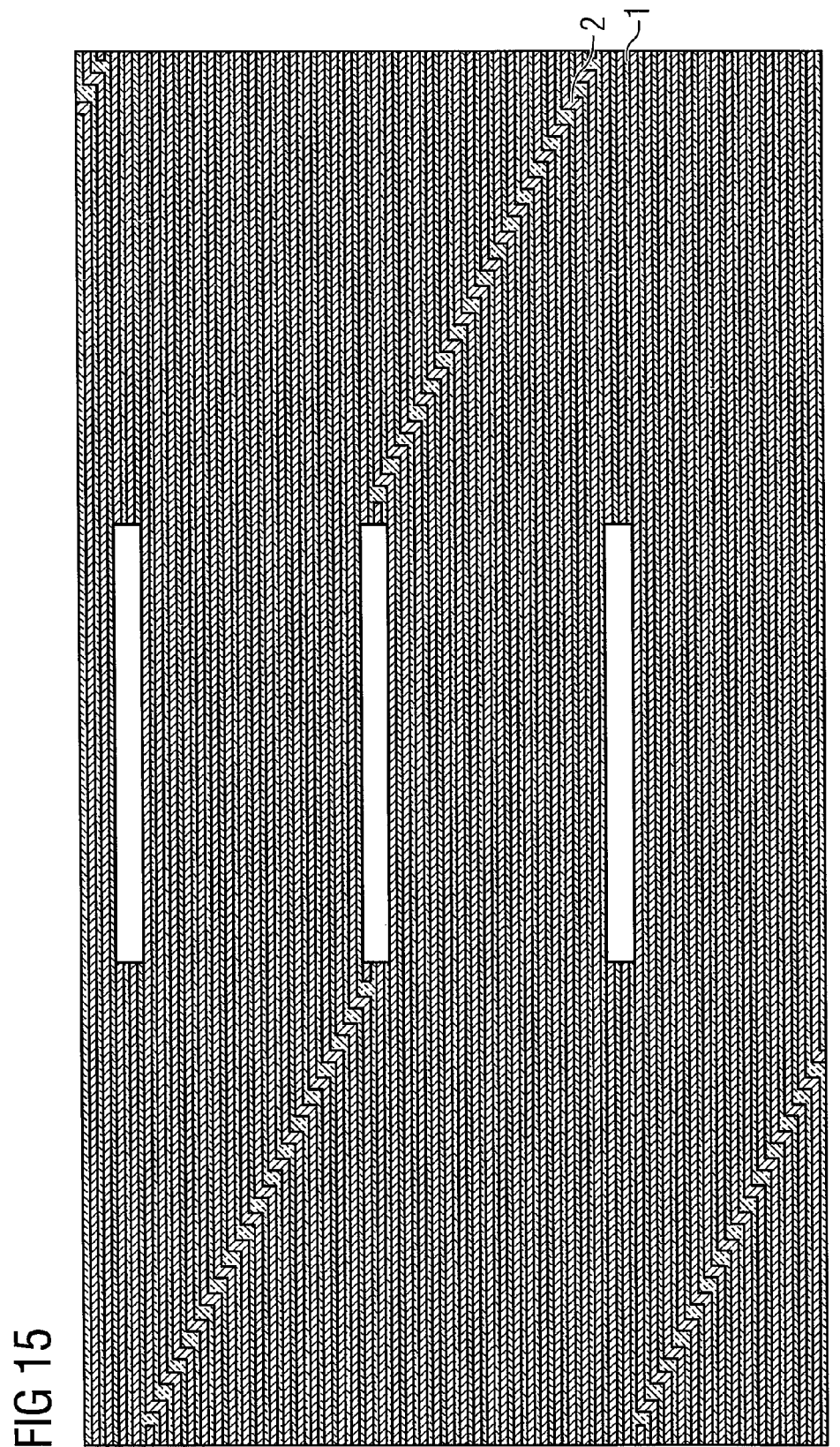
FIG. 15 shows a schematic top view of the structure of a fifth embodiment.
Figure 16:
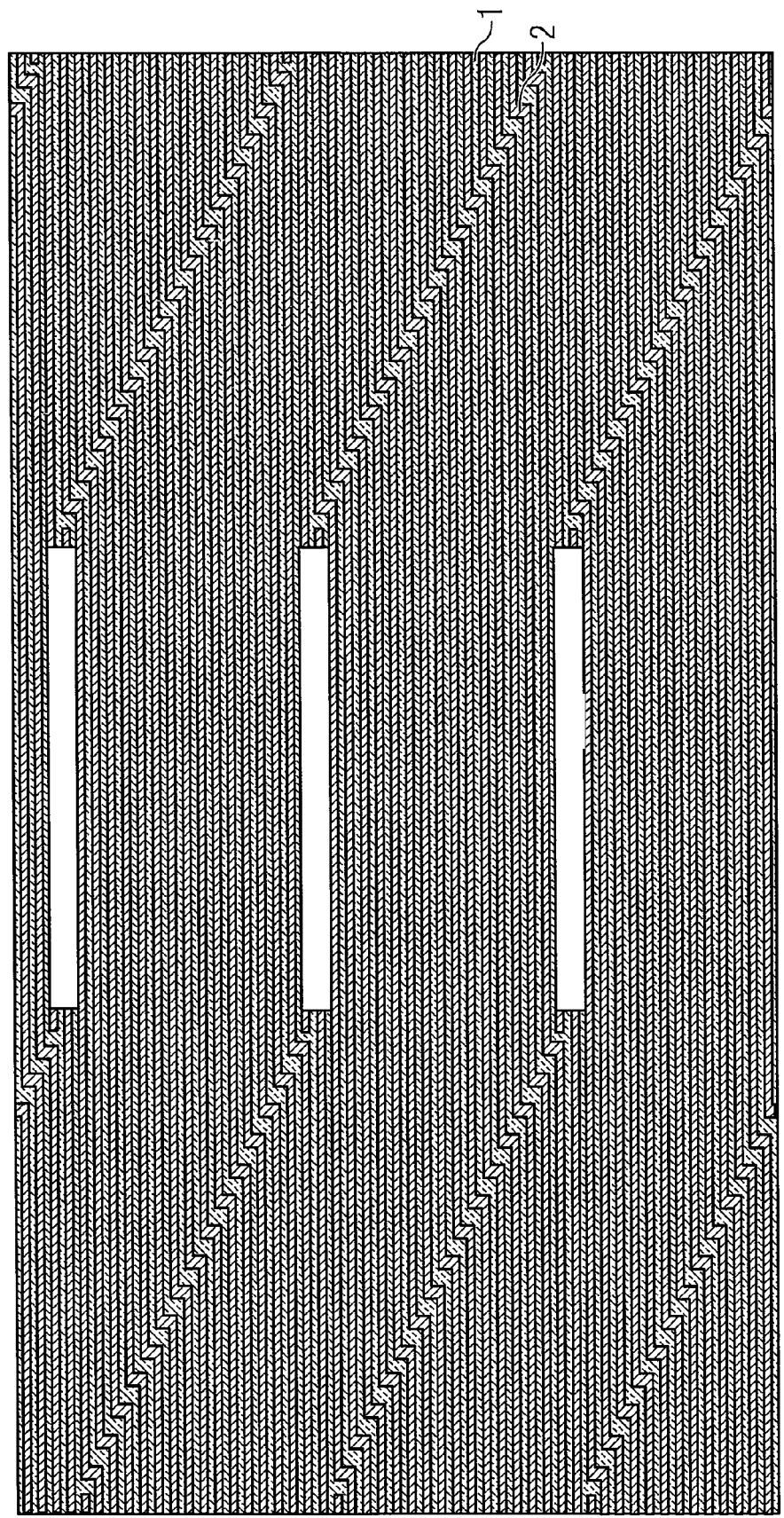
FIG. 16 shows a schematic top view of the structure of a sixth embodiment.

FIG. 14 to 16 depict double sided fanout patterns. For the sake of clarity the array lines and the fanouts are not depicted in their correct size.

Figure 17:
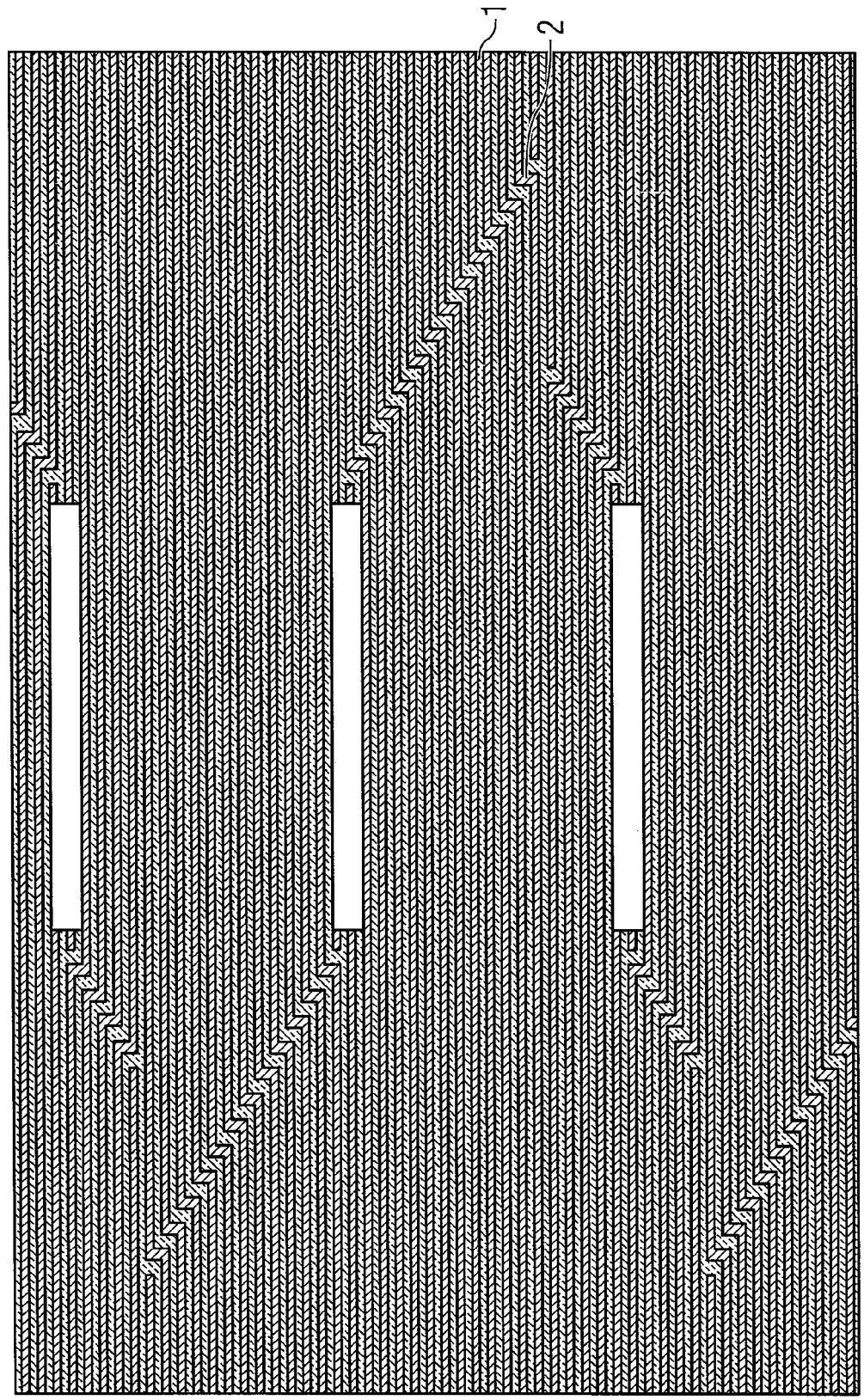
FIG. 17 shows a schematic top view of the structure of a seventh embodiment.

FIG. 17 shows a variant of a double sided fanout pattern like the one depicted in FIG. 14 to 16 in form of an asymmetric tree.

What is claimed is:

1. A semiconductor device comprising:
    a first structure comprising a plurality of, at least in part, parallel linear structures oriented along a first direction, each parallel linear structure separated from a neighboring parallel linear structure by a sublithographic spacer structure;
    a second structure comprising a plurality of pad structures, the second structure forming at least in part, a linear structure, a curved structure; a piecewise linear structure and/or a piecewise curved structure, the second structure being positioned at an angle to the first structure such that the plurality of pad structures intersect at least one of the linear structures of the first structure, wherein the plurality of pad structures are oriented along a second direction on a first line, the second direction oriented at an acute angle relative to the first direction; and
    wherein at least one pad structure comprises a widening of at least one linear structure in the first structure.

2. The semiconductor device according to claim 1, further comprising contacts positioned adjacent the plurality of pad structures.

3. The semiconductor device according to claim 1, wherein each pad structure comprises either a rectangular structure or a polygonal structure.

4. The semiconductor device according to claim 1, wherein the pad structures are part of a staggered pattern, a single sided fan-out pattern and/or a double sided fan-out pattern.

5. The semiconductor device according to claim 1, wherein the first structure comprises at least part of a plurality of conducting lines, an array pattern, a bit line pattern or a word line pattern.

6. The semiconductor device according to claim 1, comprises a semiconductor device selected from the group consisting of memory chips, Flash memory chips, DRAM memory chips, NROM memory chips, optoelectronic devices, microprocessors, and microelectromechanical systems.

7. An electronic device with at least one semiconductor device according to claim 1.

8. A mask system for manufacturing structures in a semiconductor device, the mask system comprising:
    a first mask comprising a plurality of, at least in part, linear structures as a first structure, further comprising a second structure comprising a plurality of pad structures, forming, at least in part, a sequence of pad structures that is positioned at an angle to the first structure along a first line, each of the plurality of pad structures intersecting at least two of the linear structures in the first structure; and
    a second mask with contact hole structures that are positioned so that they lie at least partially in the plurality of pad structures.

9. A semiconductor device comprising:
    a first structure comprising a plurality of parallel linear structures, the plurality of parallel liner structures oriented along a first direction;
    a second structure comprising a first plurality of pad structures, the first plurality of pad structures being oriented along a second direction, the second direction oriented at a first acute angle relative to the first direction, wherein each of the first plurality of pad structures intersects at least two of the plurality of parallel linear structures;
    wherein the second structure comprises one of a curved structure and a piecewise curved structure and/or wherein the first plurality of pad structures are either part of a staggered pattern or part of a double sided fan-out pattern.

10. The semiconductor device according to claim 9, further comprising contacts positioned adjacent the first plurality of pad structures.

11. The semiconductor device according to claim 9, wherein each pad of the first plurality of pad structures comprises a rectangular structure.

12. The semiconductor device according to claim 9, wherein each pad of the first plurality of pad structures comprises a polygonal structure.

13. The semiconductor device according to claim 9, wherein at least one pad of the first plurality of pad structures comprises a first dimension greater than a width of at least one structure of the plurality of parallel linear structures.

14. The semiconductor device according to claim 9, wherein the first structure comprises at least part of a plurality of conducting lines, an array pattern, a bit line pattern or a word line pattern.

15. The semiconductor device according to claim 9, wherein the second structure further comprises a second plurality of pad structures, the second plurality of pad structures being oriented along a third direction, the third direction oriented at a second acute angle relative to the first direction, wherein each of the second plurality of pad structures intersects at least two of the plurality of parallel linear structures.

16. The semiconductor device according to claim 15, wherein the first and the second plurality of pad structures are part of a fan-out pattern.

17. A semiconductor device comprising:
    a first plurality of parallel linear structures, the first plurality of parallel linear structures oriented along a first direction;
    a second plurality of parallel linear structures, the second plurality of parallel liner linear structures oriented along the first direction, wherein each linear structure of the first plurality of parallel linear structures is separated by a linear structure of the second plurality of parallel linear structures;
    a first plurality of pad structures, the first plurality of pad structures being oriented along a second direction on a first line, the second direction being at an acute angle relative to the first direction, wherein each of the first plurality of pad structures intersects at least two of the first plurality of parallel linear structures;
    a second plurality of pad structures, the second plurality of pad structures being oriented along the second direction on a second line, wherein each of the second plurality of pad structures intersects at least two of the second plurality of parallel linear structures; and
    wherein the first line and the second line overlap.

18. The semiconductor device according to claim 17, wherein the first and the second plurality of pad structures are part of a fan-out pattern.

19. The semiconductor device according to claim 17, further comprising a third plurality of pad structures, the third plurality of pad structures being oriented along a third direction on a third line, the third direction oriented at a second acute angle relative to the first direction, wherein each of the third plurality of pad structures intersects at least two of the first plurality of parallel linear structures.

20. The semiconductor device according to claim 19, further comprising a fourth plurality of pad structures, the fourth plurality of pad structures being oriented along the third direction on a fourth line, wherein each of the fourth plurality of pad structures intersects at least two of the second plurality of parallel linear structures.

21. The semiconductor device according to claim 20, wherein the first, the second, the third, and the fourth plurality of pad structures are part of a fan-out pattern.

22. A semiconductor device comprising:
    a first plurality of parallel linear structures, the first plurality of parallel linear structures oriented along a first direction;
    a second plurality of parallel linear structures, the second plurality of parallel linear structures oriented along the first direction, wherein each linear structure of the first plurality of parallel linear structures is separated by a linear structure of the second plurality of parallel linear structures;
    a first plurality of pad structures, the first plurality of pad structures being oriented along a second direction on a first line, the second direction being at an acute angle relative to the first direction, wherein each of the first plurality of pad structures intersects at least two of the first plurality of parallel linear structures; and
    wherein the second direction is about 10 degree to the first direction.

23. A semiconductor device comprising:
    a first plurality of parallel linear structures, the first plurality of parallel linear structures oriented along a first direction;
    a second plurality of parallel linear structures, the second plurality of parallel linear structures oriented along the first direction, wherein each linear structure of the first plurality of parallel linear structures is separated by a linear structure of the second plurality of parallel linear structures;
    a first plurality of pad structures, the first plurality of pad structures being oriented along a second direction on a first line, the second direction being at an acute angle relative to the first direction, wherein each of the first plurality of pad structures intersects at least two of the first plurality of parallel linear structures; and
    wherein the second direction is about 5 degree to the first direction.

* * * * *